US009773764B2

(12) United States Patent
Melone et al.

(10) Patent No.: US 9,773,764 B2
(45) Date of Patent: Sep. 26, 2017

(54) SOLID STATE DEVICE MINIATURIZATION

(71) Applicant: Intel Corporation, Santa Clara, CA (US)

(72) Inventors: Mark Melone, Frankfort, IL (US); Saeed Shojaie, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/978,315

(22) Filed: Dec. 22, 2015

(65) Prior Publication Data

US 2017/0179090 A1    Jun. 22, 2017

(51) Int. Cl.
*H01L 23/48*     (2006.01)
*H05K 1/14*      (2006.01)
*H01L 21/00*     (2006.01)
*H01L 25/16*     (2006.01)
*H01L 25/00*     (2006.01)
*H01L 23/498*    (2006.01)
*H01L 23/31*     (2006.01)
*H01L 21/56*     (2006.01)
*H01L 21/768*    (2006.01)

(52) U.S. Cl.
CPC ........ *H01L 25/162* (2013.01); *H01L 21/565* (2013.01); *H01L 21/76802* (2013.01); *H01L 21/76877* (2013.01); *H01L 23/3107* (2013.01); *H01L 23/481* (2013.01); *H01L 23/49833* (2013.01); *H01L 23/49838* (2013.01); *H01L 25/50* (2013.01)

(58) Field of Classification Search
CPC ............... H01L 25/162; H01L 21/565; H01L 21/76802; H01L 21/76877; H01L 21/49833; H01L 23/49838; H01L 23/3107; H01L 25/0657; H01L 23/481; H01L 23/49833; H01L 25/50; H01L 23/49816

See application file for complete search history.

(56) References Cited

U.S. PATENT DOCUMENTS 7,242,081 B1 *  7/2007  Lee ................... H01L 25/0657
                                                      257/686
8,319,338 B1   11/2012  Berry et al.
(Continued)

OTHER PUBLICATIONS

"International Application Serial No. PCT/US2016/063293, International Search Report dated Mar. 13, 2017", 3 pgs.
(Continued)

*Primary Examiner* — Alonzo Chambliss
(74) *Attorney, Agent, or Firm* — Schwegman Lundberg & Woessner, P.A.

(57) ABSTRACT

One or more example embodiments of miniaturized electric devices are disclosed. In some example embodiments, the electric device includes a first thin substrate layer and a second thin substrate layer positioned above the first thin substrate layer. The electric device further includes one or more components electrically coupled to the first thin substrate layer. An overmold compound is deposited covering the one or more components between the first thin substrate and the second thin substrate. The electric device further includes one or more through mold vias that electrically and communicatively connect the first thin substrate layer and the second thin substrate layer.

19 Claims, 7 Drawing Sheets

(56) References Cited

U.S. PATENT DOCUMENTS

| | | | |
|---|---|---|---|
| 8,508,045 B2* | 8/2013 | Khan | H01L 23/552 257/685 |
| 8,779,606 B2* | 7/2014 | Yim | H01L 23/10 257/686 |
| 2006/0175695 A1* | 8/2006 | Lee | H01L 23/13 257/686 |
| 2006/0220210 A1* | 10/2006 | Karnezos | H01L 23/3135 257/686 |
| 2006/0255458 A1 | 11/2006 | Dangelmaier | |
| 2008/0006942 A1* | 1/2008 | Park | H01L 25/105 257/738 |
| 2008/0308950 A1* | 12/2008 | Yoo | H01L 25/16 257/778 |
| 2009/0140408 A1* | 6/2009 | Lee | H01L 25/105 257/686 |
| 2009/0243065 A1* | 10/2009 | Sugino | H01L 23/16 257/686 |
| 2010/0072598 A1* | 3/2010 | Oh | H01L 25/105 257/686 |
| 2012/0018897 A1 | 1/2012 | Park et al. | |
| 2012/0074586 A1* | 3/2012 | Seo | H01L 25/16 257/774 |
| 2013/0292833 A1* | 11/2013 | Won | H01L 23/49816 257/738 |
| 2014/0339692 A1* | 11/2014 | Kim | H01L 23/36 257/713 |
| 2014/0339708 A1* | 11/2014 | Jang | H01L 23/34 257/777 |
| 2015/0069637 A1* | 3/2015 | Zhao | H01L 24/29 257/778 |
| 2015/0077962 A1 | 3/2015 | Mirpuri et al. | |
| 2015/0255360 A1* | 9/2015 | Hsu | H01L 23/3128 257/687 |
| 2015/0279804 A1* | 10/2015 | Raravikar | H01L 24/17 257/737 |
| 2015/0295098 A1 | 10/2015 | Toda | |
| 2016/0056058 A1* | 2/2016 | Haba | G01R 31/2886 438/107 |

OTHER PUBLICATIONS

"International Application Serial No. PCT/US2016/063293, Written Opinion dated Mar. 13, 2017", 9 pgs.

* cited by examiner

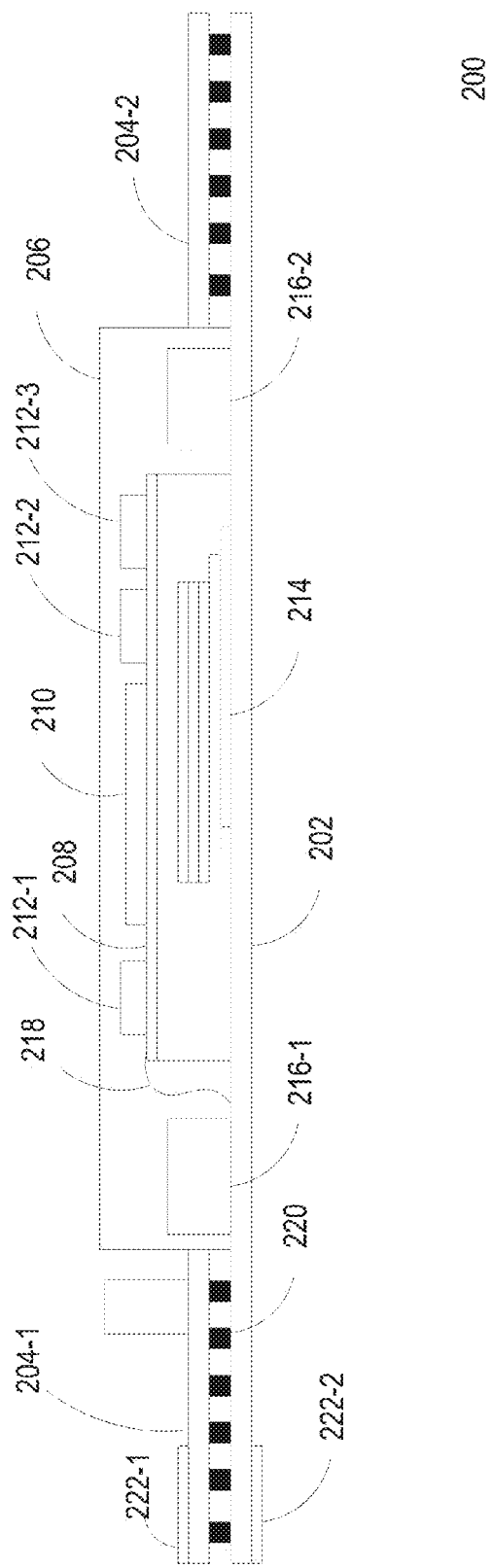

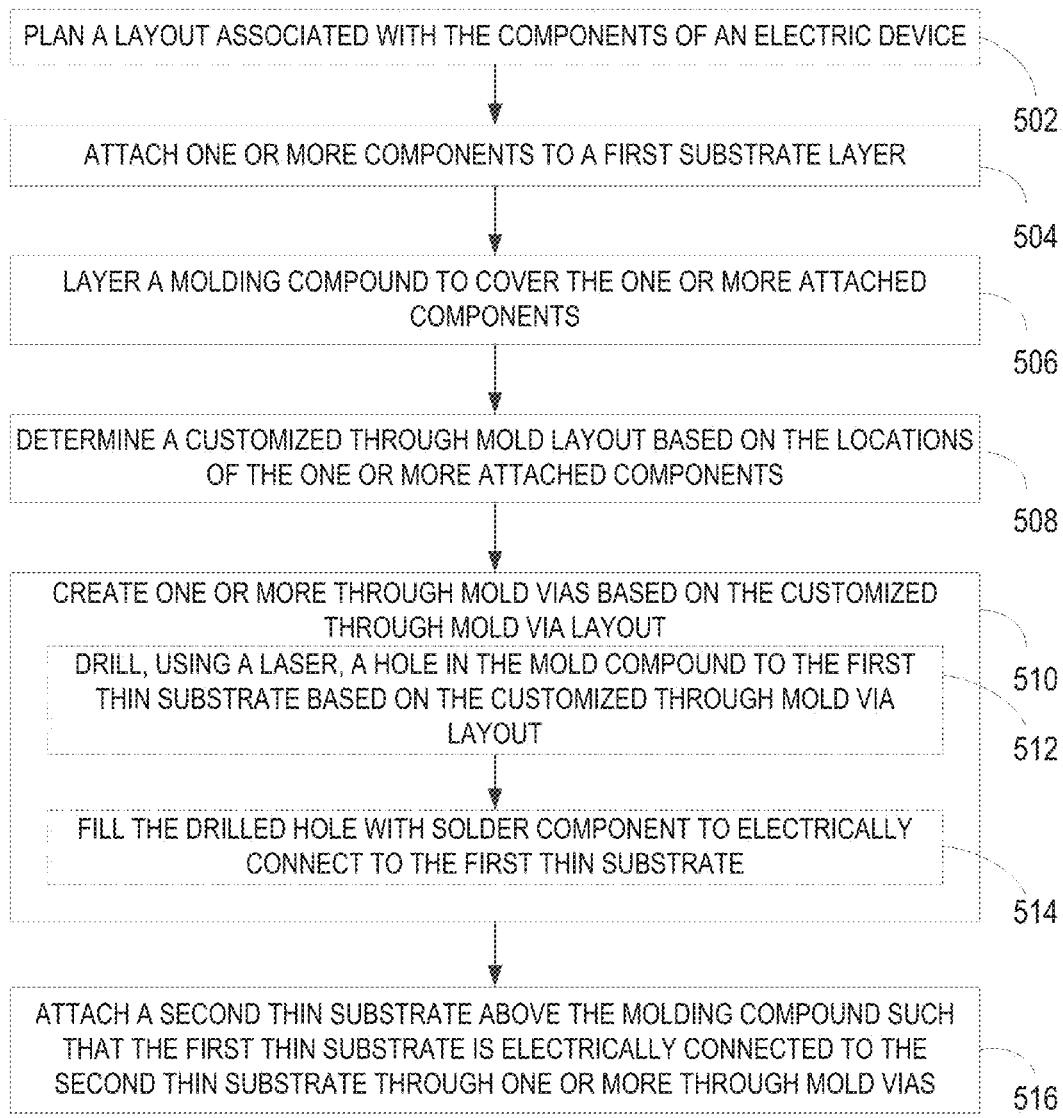
FIG. 5    500

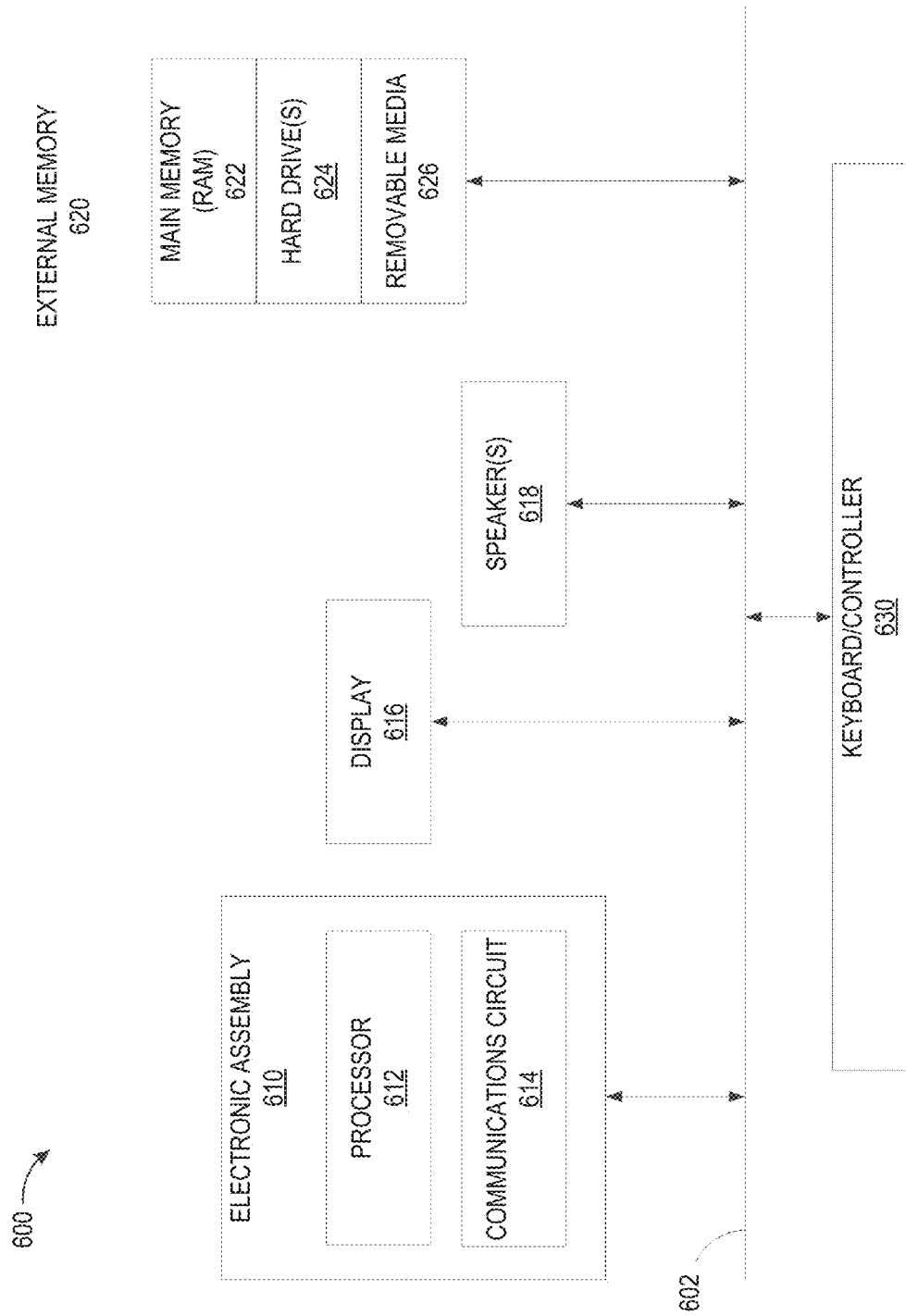

SOLID STATE DEVICE MINIATURIZATION

TECHNICAL FIELD

Embodiments described herein generally relate to electrical interconnections in micro electrical devices.

BACKGROUND

Electronic devices have grown increasingly small and power efficient. As such, each component within an electronic device (e.g., a smart phone, laptop, tablet, or other size dependent device) needs to be developed in smaller sizes. In an effort to decrease the size of various electric components a variety of strategies have been used. Thus, any strategy that enables further reduction in size is important.

For example, solid state drives (SSDs) have been developed in smaller form factors for use in ultrabooks, tablets, 2 in 1s, and so on. The standard 1.8 inch and 2.5 inch form factors were developed to meet the need for smaller form factors. More recently, caseless form factors have been developed.

BRIEF DESCRIPTION OF THE DRAWINGS

FIG. 2 shows a cross-sectional representation of an electric device 200.

FIG. 5 is a flow diagram illustrating a method, in accordance with some example embodiments, for creating a miniature solid state device.

FIG. 6 is block diagram of an electronic system in accordance with some example embodiments.

DESCRIPTION OF EMBODIMENTS

Figure 1A:
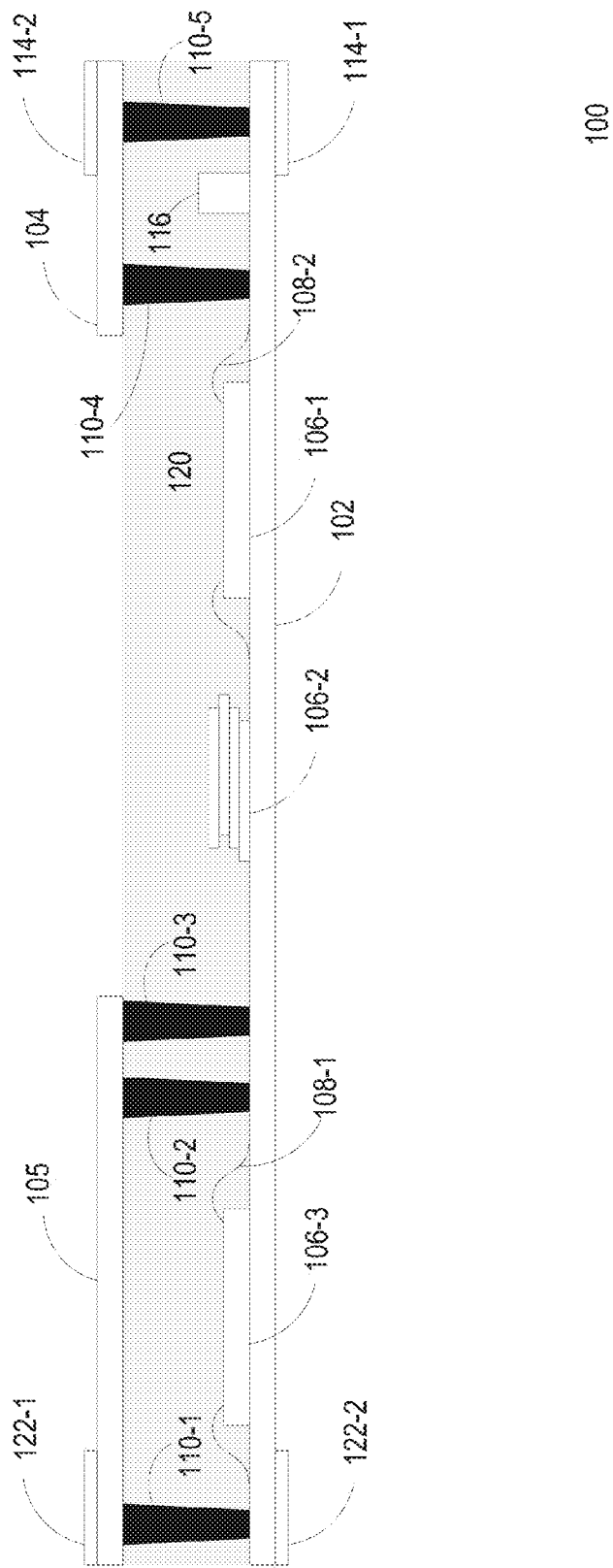
FIGS. 1A-1B shows a cross-sectional representation of an electric device.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

There is significant incentive to make electric devices in small form factors to enable more convenient consumer devices. Solid state drive devices are a type of electric devices for which size is an increasingly important factor. These devices are used in a variety of electronic devices including personal computers, smart phones, tablets, laptops, personal music players, and so on.

In this example, the solid state drive has been moved into a caseless form factor so that the overall profile size (z-height) can be reduced. This electric device includes two thin substrates. The thin substrates are designed to be thinner that typical substrates are and as thin as 0.3 millimeters in thickness or even thinner depending on design requirements. The first thin substrate is positioned at the bottom of the device. The second thin substrate is positioned at the top of the device. In some example embodiments, the thin substrates are printed circuit boards (PCBs).

One or more components are physically, electrically, and communicatively coupled to the first thin substrate. In some example embodiments, the components include one or more active components such as transistors, diodes, field-effect transistors (FETs), other discrete semiconductors, integrated circuits, and so on. In some example embodiments, the components include one or more passive components such as resistors.

The space between the first thin substrate (to which one or more components are attached) and the second thin substrate (which is positioned above the first thin substrate) is filled with mold compound. Thus, this mold compound fills the empty space between the lower (first) thin substrate and upper (second) thin substrate.

In some example embodiments, through mold vias (TMVs) are drilled through the mold. In some example embodiments, the drilled TMVs are then filled with a conductive material to electronically and communicatively connect the second thin substrate and the first thin substrate (e.g., connecting the top substrate to the bottom substrate for communication).

The through mold vias can be placed anywhere in the electric device. With the freedom to customize the location of TMVs within the electric device, there is an increased amount of space available for components in between the first thin substrate and the second thin substrate. With the increased amount of available space in between the two substrates, the electric device can be configured to smaller and more efficient form factors.

Thus, the total size of the electric piece is shrunk by including one or more components between the upper and lower substrates. Indeed, in some cases, all components can be fit between the two substrates such that the total profile (or z-height) of the electric device is similar to the thickness of the substrate alone in previous technologies. This drastic decrease in size allows these electric devices to be used in smaller devices and in more creative ways.

In some example embodiments, an entire system is put into a single package to create a system-in-package (SiP). SiPs are then connected to a substrate that allows them to be used in larger devices. Thus, SiPs can be fit into different form factors. Being able to adopt one SIP device to multiple form factors and thus multiple market segments increases the usefulness of the SiP.

In some example embodiments, the height (z-height) can be reduced by using two thin substrates. The first thin substrate is placed on the bottom and is connected through solder connections to the second thin substrate which is placed above the first thin substrate. The second thin substrate includes at least one gap or hole such that it does not cover the first thin substrate (the lower substrate) completely. Instead, at least one section of the first thin substrate is visible through the second thin substrate when viewed from above.

The SiP is then connected to the first thin substrate (e.g., physically and communicatively) at a position matching that of the gap in the second thin substrate, such that the SiP protrudes through the gap in the second thin substrate. In this way, the total height of the SiP package is reduced to the height of the first thin substrate plus the height of the SiP. Thus, if the first thin substrate is 0.3 mm thick and the SiP is 0.6 mm high, the total height is 0.9 mm. Previously SiP components could be much thicker with, for example, a 0.8 mm substrate and a 1.2 mm SiP.

FIG. 1A shows a cross-sectional representation of an electric device 100. In some example embodiments, the electric device 100 is a solid state drive that provides memory services. The electric device 100 includes two thin substrates. The first thin substrate 102 is positioned at the bottom of the electric device 100. The second thin substrate 104 is positioned above the first thin substrate 102. Each substrate is composed of a thin slice of an electrical insulator or semiconductor such as silicon, silicon dioxide, aluminum oxide, sapphire, germanium, gallium arsenide, an alloy of silicon and germanium, indium phosphide, or other appropriate substrate material.

In some example embodiments, the thin substrates (both the first 102 and the second 104) are thinner than typical substrates in electrical devices 100. For example, a typical substrate may be 0.8 millimeters in thickness. The first thin substrate 102 and the second thin substrate 104 are as thin as 0.3 mm.

One or more components (106-1 to 106-3) are then attached to the first thin substrate 102. In some example embodiments, the components 106-1 to 106-3 are connected to the first thin substrate 102 electrically, physically, and communicatively, such that each component 106-1 to 106-3 is able to communicate with other components 106-1 to 106-3 of the electrical device 100. In some example embodiments, the components 106-1 to 106-3 are electrically connected to the first thin substrate 102 via one or more wire bonds 108-1 to 108-2. In some example embodiments, the components 106-1 to 106-3 can be connected to the first thin substrate by other methods, such as a flip chip interconnect.

In some example embodiments, the second thin substrate 104 includes a gap or hole, where it does not overlap vertically with the first thin substrate 102. For example, when viewed from above, the second thin substrate may include a gap or hole that allows the first thin substrate to be visible.

In other example embodiments, the second thin substrate 104 includes two separate thin substrate 104 and 105 that each cover a portion of the first thin substrate 102, but are not connected. In yet other examples, it is possible to have a gap or hole in the middle of the second thin substrate but still have both ends of the substrate (104 and 105 in this case) connected around the hole.

In some example embodiments, a molding compound 120 is used to fill in space between the first thin substrate 102 and the second thin substrate 104.

In some example embodiments, one or more through mold vias (TMVs) are drilled into through the molding compound 120. The TMVs can be filled with an electrically conductive material (e.g., solder) such that the first thin substrate 102 is communicatively coupled to the second thin substrate 104.

Each TMV can be placed in a customized position within the molding compound 120. In this way, the components 106-1 to 106-3 on the first thin substrate 102 (e.g., 106-1 to 106-3, 116, and so on) can be placed as needed and the through mold vias can be placed through the mold 120 wherever needed. In some example embodiments, the through mold vias are made based on the layout of the components 106-1 to 106-3 and the level of communication needed.

In some example embodiments, the electric device 100 includes one or more edge connectors (114-1 to 114-2) that connect the electric device 100 to an outside device. For example, the electric device 100 uses the edge connector 114-1, 114-2 (e.g., made of a conductive material such as copper) to communicate to a smart phone in which it is inserted as a memory storage device.

In some example embodiments, the electric device 100 includes ground connectors that connect 122-1 and 122-2 the electric components 106-1 to 106-3 of the electric device 100 to the ground.

In some example embodiments, the electric device 100 also includes passive devices 116 (e.g., such as a resistor) attached to the first thin substrate 102.

Figure 1B:
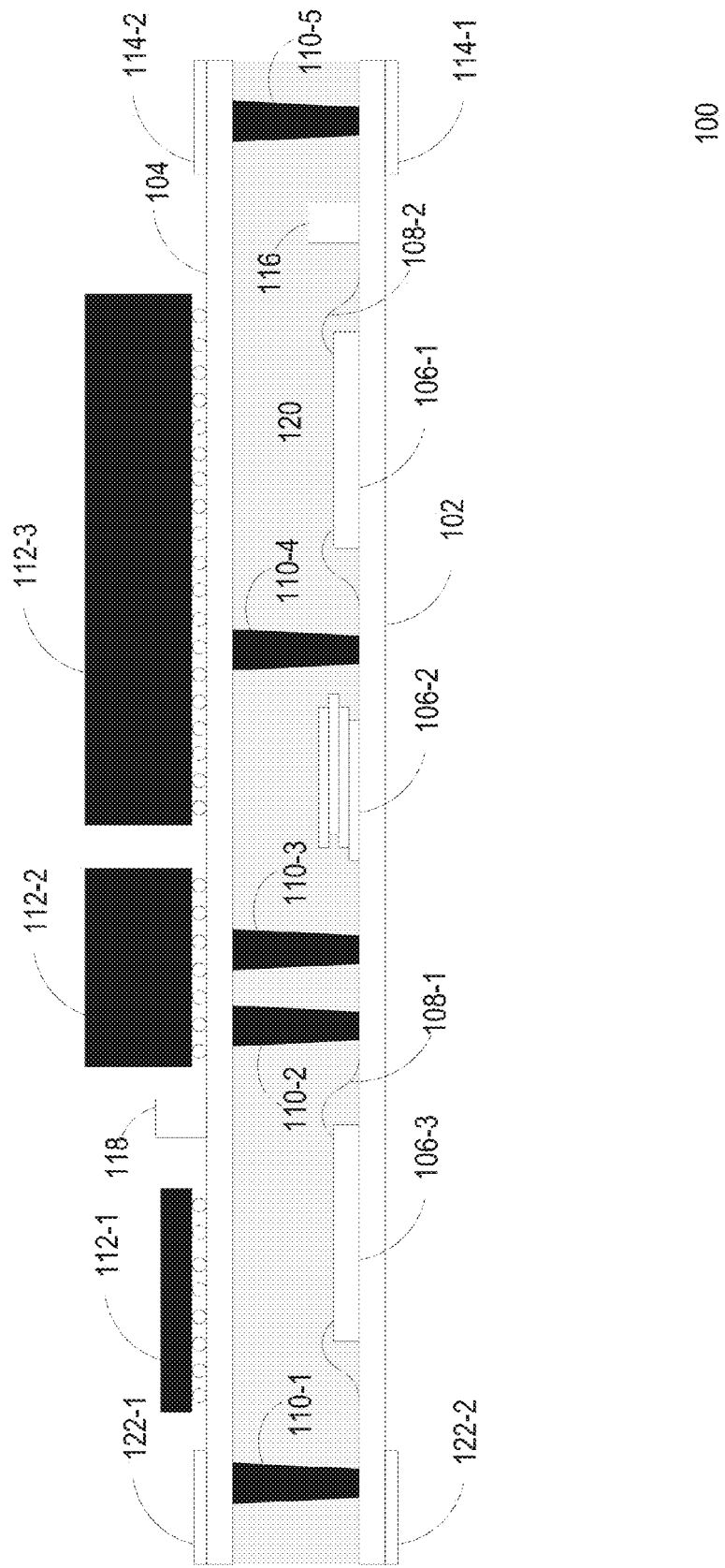

FIG. 1B shows a cross-sectional representation of an electric device 100, that is a variation of the electric device 100 shown in FIG. 1A. In some example embodiments, the electric device 100 is a solid state drive that provides memory services.

The electric device 100 includes two thin substrates. The first thin substrate 102 is positioned at the bottom of the electric device 100. The second thin substrate 104 is positioned above the first thin substrate 102. As discussed above in reference to FIG. 1A, the thin substrates (both the first 102 and the second 104) are thinner than typical substrates in electrical devices 100. For example, a typical substrate may be 0.8 millimeters in thickness. The first thin substrate 102 and the second thin substrate 104 are as thin as 0.3 mm.

As above, one or more components (106-1 to 106-3) are then attached to the first thin substrate 102 and the components 106-1 to 106-3 are electrically connected to the first thin substrate 102 via one or more wire bonds 108-1 to 108-2. In some example embodiments, a molding compound 120 is used to fill in space between the first thin substrate 102 and the second thin substrate 104.

In some example embodiments, one or more through mold vias (TMVs) are drilled into through the molding compound 120. The electric device 100 includes one or more edge connectors (114-1 to 114-2) that connect the electric device 100 to an outside device. For example, the electric device 100 uses the edge connectors 114-1, 114-2 (e.g., made of a conductive material such as copper) to communicate to a smart phone in which it is inserted as a memory storage device. In some example embodiments, the electric device 100 also includes passive devices 116 (e.g., such as a resistor) attached to the first thin substrate 102.

In this example embodiment, one or more components 112-1 to 112-3 are connected to the second thin substrate 104. These components 112-1 to 112-3 include one or more surface mounted devices (SMD) including transistors, diodes, field-effect transistors (FETs), other discrete semiconductors, integrated circuits and so on.

In some example embodiments, one or more passive components 118 are also connected to the second thin substrate 104. In some example embodiments, the passive components 118 include resistors, capacitors, and inductors.

In some example embodiments, the active components (112-1 to 112-3) are mechanically fixed and electrically connected to the second thin substrate 104 using soldering. In some example embodiments, a variety of soldering techniques can be used to attach the components 112-1 to 112-3 to the second thin substrate 104. For example, through-hole technology is used to insert component leads in holes or gaps in the PCB which are then filled with solder.

In other example embodiments, surface-mount technology (SMT) is used and the components 112-1 to 112-3 are glued on pads or leads on the surface of the PCB.

In the current example, the active components (112-1 to 112-3 have been attached to the second thin substrate 104 with a ball grid array. A ball grid array is a series of regularly spaced solder points that connect a component (e.g., memory, ASIC) to the PCB. This allows the active components 112-1 to 112-3 to communicate with both the first thin substrate 102 and with outside electrical devices via the edge connectors 114-1 and 114-2.

FIG. 2 shows a cross-sectional representation of an electric device 200. In this example, the depicted electric device 200 is a system in a package (SIP). A SIP performs all or most of the functions of an electric system 200. In a SIP the integrated circuit dies can be stacked vertically (as opposed to horizontally spaced along a substrate) to conserve space and improve communication efficiency.

The SIP includes a die stack 208. The die stack 208 includes an application-specific integrated circuit 210, one or more components 212-1 to 212-3 including one or more passive components 118 (e.g., resistors, capacitors, inductors, and so on) or active components 112-1 to 112-3 (e.g., diodes and so on).

In some example embodiments, the die stack 208 includes one or more different dies including NAND memory, DRAM, or other integrated circuits.

In some example embodiments, the SIP 206 also includes a variety of miscellaneous components (216-1 and 216-2) that serve the various purposes of the SIP 206 such as resistors, inductors, capacitors, voltage regulators, thermal sensors, interposers (another PCB or substrate with active/passive components), and so on.

In some example embodiments, the SIP 206 is connected to a first thin substrate 202. Each substrate is composed of a thin slice of an electrical insulator or semiconductor such as silicon, silicon dioxide, aluminum oxide, sapphire, germanium, gallium arsenide, an alloy of silicon and germanium, indium phosphide, or other appropriate substrate material. In some example embodiments, the die stack 208 is connected to the first thin substrate 202 by a wire bond 218 that connects the die stack 208 to the first thin substrate 202 electrically and communicatively.

In some example embodiments, the first thin substrate 202. is connected to a second thin substrate (204-1 and 204-2) positioned above it. The two substrates are connected with a series of solder joints 220 that connect the first thin substrate 202 and the second substrate 204 together physically, electrically, and communicatively. In this way, the components 212-1 to 212-3 connected to the first thin substrate 202 can communicate to components attached to the second thin substrate (204-1 to 204-2).

In some example embodiments, the first thin substrate 202 and the second thin substrate 204 are both connected to an edge connector 222-1 and 222-2. The edge connectors 222-1 and 222-2 allows the electric device 200 to outside electric devices and components.

Figure 3:
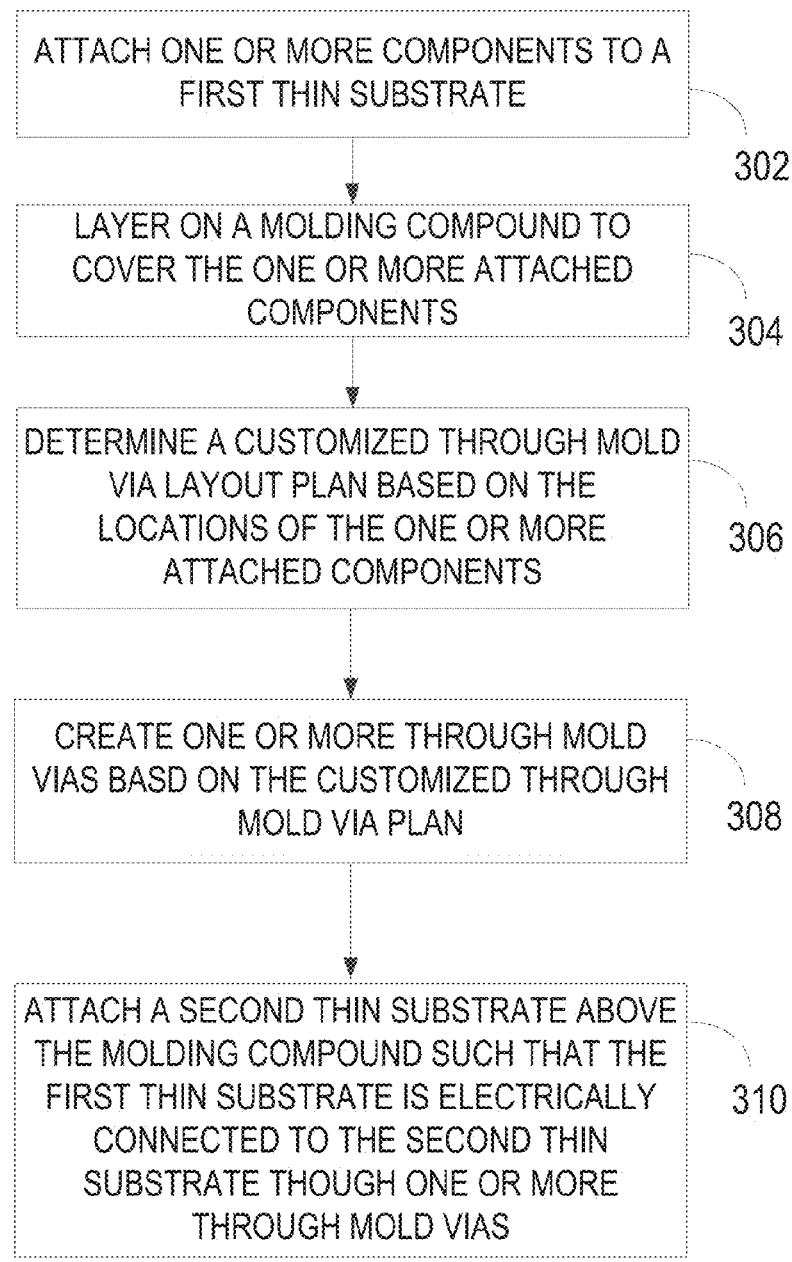
FIG. 3 is a flow diagram illustrating a method, in accordance with some example embodiments, for creating a miniature solid state device.

FIG. 3 is a flow diagram illustrating a method, in accordance with some example embodiments, for creating a miniature solid state device. Each of the operations shown in FIG. 3 may correspond to manufacturing steps carried out during the creation of an electric device 100.

In some example embodiments, one or more components 106-1 to 106-3 and 116 are attached (302) to a first thin substrate 102. In some example embodiments, components include both active components 106-1 to 106-3 such as diodes, FETs, ICs, and passive components 116 such as resistors, capacitors, and inductors.

Each component is attached to the thin substrate using through-hole technology, surface mount technology, solder, adhesive attach or a combination of these methods. In some example embodiments, the components 106-1 to 106-3 are electrically connected to the substrate through a wire bond 108-1.

Once the components 106-1 to 106-3 are attached to the first thin substrate 102, a molding compound 120 layered (304) on top of the one or more components 106-1 to 106-3, such that the molding compound 120 covers the one or more components 106-1 to 106-3. The over molding compound is polymeric compounds.

Once the over mold component has been layered on, a customized through mold via (TMV) plan is determined (306) based on the locations of the one or more attached components 106-1 to 106-3. In this way, the TMVs can be placed wherever needed, so long as no components 106-1 to 106-3 and 116 are current placed in that location. In some example embodiments, the position of the components 106-1 to 106-3 and the position of the TMV's are planned simultaneously to maximize efficiency.

Using customized TMV placement allows components 106-1 to 106-3 to be placed within a larger total space than otherwise would normally be available. In this way, the components 106-1 to 106-3 can be placed as needed and the TMVs can be placed in the portions not occupied by components 106-1 to 106-3, wherever they are.

One or more through mold vias (110-1 to 110-5) are created based on the customized through mold via plan (308). In some example embodiments, the TMVs are created by using a laser to drill through the molding to the thin substrate below. The thin substrate is designed to have contacts on the substrate where the holes are going to be drilled by the laser.

In some example embodiments, the holes created by the laser drilling are filled with solder compound (or any electrically conductive material). The entire electric device 100 can then be heated to reflow the solder compound.

A second thin substrate 104 is then attached (310) over the molding compound 120 such that the second thin substrate 104 is electrically connected to the first thin substrate 102 through the one or more through mold vias (110-1 to 110-5).

Figure 4:
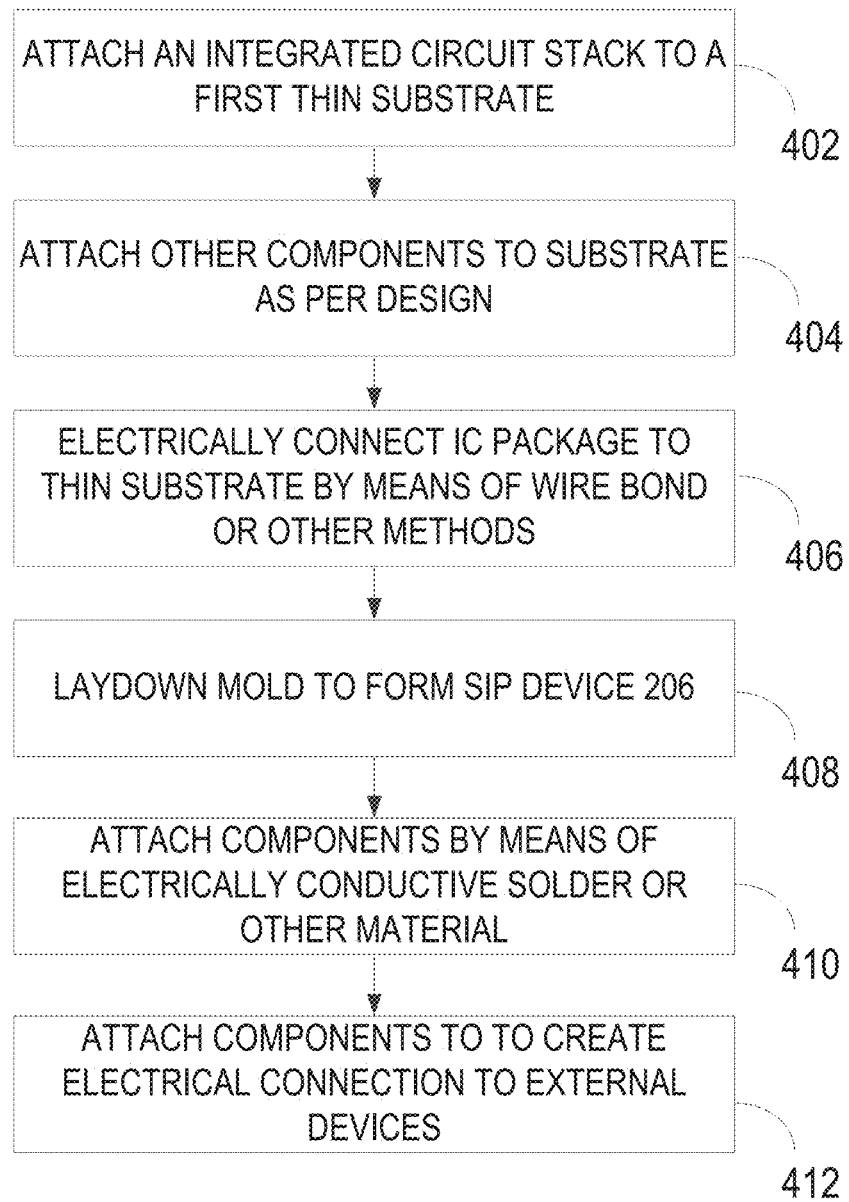
FIG. 4 is a flow diagram illustrating a method, in accordance with some example embodiments, for creating a system in a package with a decreased z-height.

FIG. 4 is a flow diagram illustrating a method, in accordance with some example embodiments, for creating a system in a package with a decreased z-height. Each of the operations shown in FIG. 4 may correspond to manufacturing steps carried out during the creation of an electric device 200.

In some example embodiments, an integrated circuit stack (e.g., stack 214 in FIG. 2) is attached (402) to a first thin substrate (e.g., substrate 202 in FIG. 2). In some example embodiments, the IC stack is mechanically fixed and electrically connected to the thin substrate 204 using one of a variety of soldering techniques. In other example embodiments, another connection method such as through-hole technology or surface mount technology is used to fix the IC stack 214 to the first thin substrate.

Once the IC stack has been attached to the substrate, one or more other components (such as 216-1, 216-2, 212-1, 212-3, 210, and son on as seen in FIG. 2) are connected (404) to either the first thin substrate 202 or substrate 208 as needed.

In some example embodiments, the IC package (e.g., package 214 as seen in FIG. 2) is electrically connected (406) to the first thin substrate (e.g., substrate 202 in FIG. 2) via a wire bond (e.g., the wire bond 218 in FIG. 2) or the electrical connection methods.

In some example embodiments, a layer of mold is laid down (408) to form the SiP device 206. Once the SiP has been fully formed, a second thin substrate (e.g., the thin substrate 204-1 in FIG. 2) is attached to the first thin substrate (e.g., the thin substrate 202 in FIG. 2) by electrically conducive solder or other connection materials or techniques.

In some example embodiments, a third thin substrate (e.g., the thin substrate 204-2 in FIG. 2) is connected to the first thin substrate (e.g., the thin substrate 202 in FIG. 2) so as to leave a gap or hole in the upper thin substrate layer.

One or more components (e.g., components 222-1 and 222-2 in FIG. 2) are attached (410) to the second thin substrate (e.g., the thin substrate 204-1 in FIG. 2). The one or more components (e.g., components 222-1 and 222-2 in FIG. 2) are edge connectors that connect the SiP 206 to one or more external devices (412).

FIG. 5 is a flow diagram 500 illustrating a method, in accordance with some example embodiments, for creating a miniature solid state device. Optional operations are indicated by dashed lines (e.g., boxes with dashed-line borders). In some embodiments, the method described in FIG. 5 is performed during the manufacturing of an electrical device 100. The method described can also be performed by any other suitable configuration of hardware.

In some example embodiments, a layout associated with the components 106-1 to 106-3 of an electric device (e.g., device 100 of FIG. 1B) is planned (502). Thus, the particular components 106-1 to 106-3 to be added to the electric device (e.g., the device 100 in FIG. 1B) as well as their respective layouts are determined based on the intended use and needs of the electric device (e.g., the device 100 in FIG. 1B). In some example embodiments, the layout is determined automatically based on one or more component layout algorithms.

In some example embodiments, a manufacturing device or system associated with manufacturing the electric device (e.g., the device 100 in FIG. 1B) attaches (504) one or more components 106-1 to 106-3 to a first substrate layer 102.

Each component is attached to the thin substrate using through-hole technology, surface mount technology, solder, adhesive attach or a combination of these methods. In some example embodiments, the components 106-1 to 106-3 are electrically connected to the substrate through a wire bond 108-1 to 108-2.

In some example embodiments, components 106-1 to 106-3 are mechanically fixed and electrically connected to the second thin substrate 104 using soldering. In some example embodiments, a variety of soldering techniques can be used to attach the components 106-1 to 106-3 to the second thin substrate 104. For example, through-hole technology is used to insert component leads in holes or gaps in the PCB and are then filled with solder.

In other example embodiments, surface-mount technology (SMT) are used and the components 106-1 to 106-3 are glued on pads or leads on the surface of the PCB. In the yet other examples, the components 106-1 to 106-3 can be attached to the second thin substrate 104 with a ball grid array. A ball grid array is a series of regularly spaced solder points that connect a component (e.g., solid state memory) to the PCB.

In some example embodiments, the first thin substrate layers and the second thin substrate layers are thin printed circuit boards. In some example embodiments, the first thin substrate layer and the second thin substrate layer are less than 0.5 millimeters thick.

In some example embodiments, a manufacturing device or system associated with manufacturing the electric device (e.g., the device 100 in FIG. 1B) layers (506) a molding compound 120 to cover the one or more attached components 106-1 to 106-3. In some example embodiments, the molding component is a polymeric compound and is non-conductive.

In some example embodiments, the manufacturing device or system determines (508) a customized through mold layout based on the locations of the one or more attached components 106-1 to 106-3. In some example embodiments, the customized through mold via layout is created simultaneously with planning the layout of the one or more components 106-1 to 106-3. Thus, when the electric device (e.g., the device 100 in FIG. 1B) is being laid out (e.g., the placement of the components 106-1 to 106-3 is determined) the placement of the TMVs is simultaneously determined to ensure that the TMVs are place appropriately.

In some example embodiments, one or more TMVs are created based on the customized through mold via layout (510). In some example embodiments, creating one or more TMVs includes drilling, using a laser, a hole in the mold compound to the first thin substrate 102 based on the customized through mold via layout (512). In some example embodiments, the hole for the TWV can be drilled by a mechanical drill or other methods.

Once the through mold vias have been drilled by a laser, the drilled holes are filled with solder component to electrically connect to the first thin substrate 102 (514). Thus, the solder material is in direct contact, both physically and electrically with the first thin substrate 102. In some example embodiments, the solder compound is reflowed (by heating) to ensure a good fill.

A second thin substrate 104 is attached (516) above the molding compound 120 such that the first thin substrate 102 is electrically connected to the second thin substrate 104 through one or more through mold vias. In some example embodiments, the second thin substrate 104 only partially covers the first thin substrate 102. In yet other example embodiments, the second thin substrate 104 is actually two separate substrates that have a gap between them.

An example of an electronic device using semiconductor chip assemblies and solders as described in the present disclosure is included to show an example of a higher level device application for the described embodiments. FIG. 6 is a block diagram of an electronic device 600 incorporating at least one device and/or method in accordance with at least one disclosed example embodiment. Electronic device 600 is merely one example of an electronic system in which example embodiments can be used. Examples of electronic devices 600 include, but are not limited to personal computers, tablet computers, mobile telephones, game devices, MP3 or other digital music players, etc. In this example, electronic device 600 comprises a data processing system that includes a system bus 602 to couple the various components of the system. System bus 602 provides communications links among the various components of the electronic device 600 and can be implemented as a single bus, as a combination of busses, or in any other suitable manner.

An electronic assembly 610 is coupled to system bus 602. The electronic assembly 610 can include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in electronic assembly 610 are a custom circuit, an application-specific integrated circuit (ASIC), or the like, such as, for example, one or more circuits (such as a communications circuit 614) for use in wireless devices like mobile telephones, personal data assistants, portable computers, two-way radios, and similar electronic systems. The IC can perform any other type of function.

The electronic device 600 can also include an external memory 620, which in turn can include one or more memory elements suitable to the particular application, such as a main memory 622 in the form of random access memory (RAM), one or more hard drives 624, and/or one or more drives that handle removable media 626 such as compact disks (CD), flash memory cards, digital video disk (DVD), and the like.

In some example embodiments, the hard drive 624 and/or the removable media 626 include solid state memory devices similar to device 100 discussed in FIGS. 1A and 1B.

In addition, the electronic assembly 610 can include a system in a package (SiP) similar to the one described as SiP 200 in FIG. 2.

The electronic device 600 can also include a display device 616, one or more speakers 618, and a keyboard and/or controller 630, which can include a mouse, trackball, touch screen, voice-recognition device, or any other device that permits a system user to input information into and receive information from the electronic device 600.

TERM USAGE

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A solid state drive, comprising:
    a first thin substrate layer;
    a second thin substrate layer positioned above the first thin substrate layer;
    one or more components electrically coupled to the first thin substrate layer;
    an overmold compound covering the one or more components between the first thin substrate and the second thin substrate;
    one or more through mold vias that electrically and communicatively connect the first thin substrate layer and the second thin substrate layer; and
    one or more edge connectors disposed on an exterior surface of a first end of the solid state drive, wherein the one or more edge connectors are configured to be in electrical communication with the one or more components and coplanar with the edges of the first and second thin substrate layers.

2. The solid state drive of claim 1, wherein the first thin substrate layer and the second thin substrate layer are thin printed circuit boards.

3. The solid state drive of claim 1, wherein the first thin substrate layer and the second thin substrate layer are less than 0.5 millimeters thick.

4. The solid state drive of claim 1, wherein the second thin substrate only partially covers the first thin substrate.

5. The solid state drive of claim 1, wherein one or more components are connected to the second thin substrate.

6. The solid state drive of claim 1, wherein the one or more components include at least one active component.

7. The solid state drive of claim 1, wherein the one or more components include NAND memory.

8. The solid state drive of claim 1, wherein the one or more components include at least one passive component.

9. A method for manufacturing a solid state drive, comprising:
    attaching one or more components to a first substrate layer;
    applying a molding compound to cover the one or more attached components;
    determining a customized through mold via layout based on the locations of the one or more attached components;
    creating one or more through mold vias based on the customized through mold via layout;
    attaching a second thin substrate above the molding compound such that the first thin substrate is electrically connected to the second thin substrate through one or more through mold vias; and
    attaching one or more edge connectors to an exterior surface of a first end of the solid state drive, wherein the one or more edge connectors are configured to be in electrical communication with the one or more components and coplanar with the edges of the first and second thin substrate layers.

10. The method of claim 9, wherein the first thin substrate layers and the second thin substrate layers are thin printed circuit boards.

11. The method of claim 9, wherein the first thin substrate layers and the second thin substrate layers are less than 0.5 millimeters thick.

12. The method of claim 9, wherein the second thin substrate only partially covers the first thin substrate.

13. The method of claim 9, wherein creating one or more though mold vias based on the customized through mold via layout further comprises:
    drilling, using a laser, a hole in the mold compound to the first thin substrate based on the customized through mold via layout; and
    filling the drilled hole with solder component to electrically connect to the first thin substrate.

14. The method of claim 9, further comprising:
    planning a layout of the one or more components.

15. The method of claim 14, wherein the customized through mold via layout is created simultaneously with planning the layout of the one or more components.

16. A solid state drive, including a first thin substrate;
    a second thin substrate connected to the first thin substrate by one or more of a series of solder points, and wherein the second thin substrate has gaps such that it does not completely overlap the first thin substrate;
    a system in a package communicatively coupled to the first thin substrate at a position such that the system in a package extends up above the second thin substrate; and
    one or more edge connectors disposed on an exterior surface of a first end of the solid state drive, wherein the one or more edge connectors are configured to be in electrical communication with the system in a package and coplanar with the edges of the first and second thin substrate layers.

17. The solid state drive of claim 16, wherein the first thin substrate layers and the second thin substrate layers are thin printed circuit boards.

18. The solid state drive of claim 16, wherein the first thin substrate layers and the second thin substrate layers are less than 0.5 millimeters thick.

19. The solid state drive of claim 16, wherein the second thin substrate includes two separate substrate pieces rather than a single substrate piece with a gap.

* * * * *

UNITED STATES PATENT AND TRADEMARK OFFICE
CERTIFICATE OF CORRECTION

PATENT NO. : 9,773,764 B2
APPLICATION NO. : 14/978315
DATED : September 26, 2017
INVENTOR(S) : Melone et al.

It is certified that error appears in the above-identified patent and that said Letters Patent is hereby corrected as shown below:

In the Claims

In Column 12, Line 15, in Claim 13, delete "though" and insert --through-- therefor Signed and Sealed this
Fifth Day of May, 2020

Andrei Iancu
*Director of the United States Patent and Trademark Office*